United States Patent
Kanda

(10) Patent No.: US 10,008,520 B2
(45) Date of Patent: Jun. 26, 2018

(54) SEMICONDUCTOR DEVICE WITH TERMINALS AND MANUFACTURING METHOD OF SEMICONDUCTOR DEVICE WITH TERMINALS

(71) Applicant: Japan Display Inc., Tokyo (JP)

(72) Inventor: Noriyoshi Kanda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days. days.

(21) Appl. No.: 15/264,735

(22) Filed: Sep. 14, 2016

(65) Prior Publication Data

US 2017/0084678 A1 Mar. 23, 2017

(30) Foreign Application Priority Data

Sep. 18, 2015 (JP) .................. 2015-185281

(51) Int. Cl.
| | | |
|---|---|---|
| *H01L 27/32* | (2006.01) | |
| *H01L 27/12* | (2006.01) | |
| *H01L 29/45* | (2006.01) | |

(52) U.S. Cl.
CPC ...... *H01L 27/1288* (2013.01); *H01L 27/3276* (2013.01); *H01L 29/45* (2013.01); *H01L 27/3265* (2013.01)

(58) Field of Classification Search
CPC . H01L 27/3262; H01L 29/45; H01L 27/1288; H01L 51/5215; H01L 2227/323;
(Continued)

(56) References Cited

U.S. PATENT DOCUMENTS

2006/0220056 A1 10/2006 Lee
2007/0075313 A1 4/2007 Kwak et al.
(Continued)

FOREIGN PATENT DOCUMENTS

JP 2000-275659 A 10/2000
JP 2004-145024 A 5/2004
(Continued)

OTHER PUBLICATIONS

Korean Office Action issued on Apr. 18, 2018 for corresponding Korean Patent Application No. 10-2016-0115655 with partial translation.

*Primary Examiner* — Jay C Chang
*Assistant Examiner* — Charles R Peters
(74) *Attorney, Agent, or Firm* — Typha IP LLC

(57) ABSTRACT

A semiconductor device in an embodiment according to the present invention includes a first terminal and a second terminal stacked with a first conductive layer including titanium or molybdenum, a second conductive layer including aluminum above the first conductive layer, and a third conductive layer including titanium or molybdenum above the second conductive layer, a first insulation layer between the first terminal and the second terminal, a second insulation layer between the first insulation layer contacting a side wall part of the first terminal, and a fourth conducing layer extending an upper surface of the first terminal and an upper surface of the second insulation layer. The first terminal and the second terminal are arranged on an exterior side of a drive circuit including a semiconductor element.

19 Claims, 16 Drawing Sheets

(58) Field of Classification Search
CPC .... G02F 1/1333; G02F 1/1343; G02F 1/1345; G02F 1/1368
See application file for complete search history.

(56) References Cited

U.S. PATENT DOCUMENTS

| | | | |
|---|---|---|---|
| 2009/0033818 A1* | 2/2009 | Nakajima | G02F 1/1345 349/43 |
| 2013/0155345 A1* | 6/2013 | Ogasawara | G02F 1/13458 349/46 |
| 2015/0188093 A1* | 7/2015 | Kim | H01L 51/5275 257/40 |

FOREIGN PATENT DOCUMENTS

| | | |
|---|---|---|
| JP | 2013-190816 A | 9/2013 |
| KR | 10-2006-0104531 A | 10/2006 |
| KR | 10-2007-0036996 A | 4/2007 |

\* cited by examiner

SEMICONDUCTOR DEVICE WITH TERMINALS AND MANUFACTURING METHOD OF SEMICONDUCTOR DEVICE WITH TERMINALS

CROSS-REFERENCE TO RELATED APPLICATIONS

This application is based upon and claims the benefit of priority from the prior Japanese Patent Application No. 2015-185281, filed on Sep. 18, 2015, the entire contents of which are incorporated herein by reference.

FIELD

The present invention is related to a semiconductor device. One embodiment of the invention disclosed in the present specification is related to a structure of a terminal part in a semiconductor device.

BACKGROUND

A semiconductor device which realizes a certain function by signal processing using a function circuit including a semiconductor element is arranged with a terminal circuit which is input with a signal from an external circuit or outputs a signal to an external circuit. For example, a semiconductor device arranged with a function circuit such as a pixel circuit and the like is arranged with a terminal part which outputs a signal to an end part of a glass substrate using a thin film transistor arranged above the glass substrate. The terminal part arranged in an end part of a glass substrate is connected with a wiring substrate (also called a flexible printed circuit (FPC) substrate) formed in a plastic substrate using an anisotropic conductive adhesive.

When adhesion of a terminal part to a ground surface is weak, even if a flexible wiring substrate is adhered using an anisotropic conductive adhesive, the terminal part also peels away from the glass substrate. As result, it is desired that adhesion to a ground surface of a terminal part is high. For example, a structure is disclosed in which a planarized film formed using an organic resin arranged above a glass substrate in order to increase adhesion of a terminal part (for example, see Japanese Laid Open Patent Publication No. 2004-145024, Japanese Laid Open Patent Publication No. 2013-190816). In addition, a structure is disclosed in which a region with low adhesion is sandwiched by regions having high adhesion in order to increase adhesion of a terminal part formed by stacking a plurality of conductive films (For example, see Japanese Laid Open Patent Publication No. 2000-275659).

SUMMARY

A semiconductor device in an embodiment according to the present invention includes a first terminal and a second terminal stacked with a first conductive layer including titanium or molybdenum, a second conductive layer including aluminum above the first conductive layer, and a third conductive layer including titanium or molybdenum above the second conductive layer, a first insulation layer between the first terminal and the second terminal, a second insulation layer between the first insulation layer contacting a side wall part of the first terminal, and a fourth conducing layer extending an upper surface of the first terminal and an upper surface of the second insulation layer. The first terminal and the second terminal are arranged on an exterior side of a drive circuit including a semiconductor element.

A manufacturing method of a semiconductor device in an embodiment according to the present invention includes forming a first insulation layer in a stripe shape in a terminal region covering a semiconductor element in a drive circuit part, stacking a first conductive layer including titanium or molybdenum, a second conductive layer including aluminum, and a third conductive layer including titanium or molybdenum, and forming a first terminal and second terminal at a position sandwiching the first insulation layer, forming a second insulation layer to cover the first terminal and a side wall of the second terminal between the first terminal and the first insulation layer and between the second terminal and the first insulation layer, and forming a fourth insulation layer reaching an upper surface of the first terminal and an upper surface of the first insulation layer.

DESCRIPTION OF EMBODIMENTS

Figure 1:
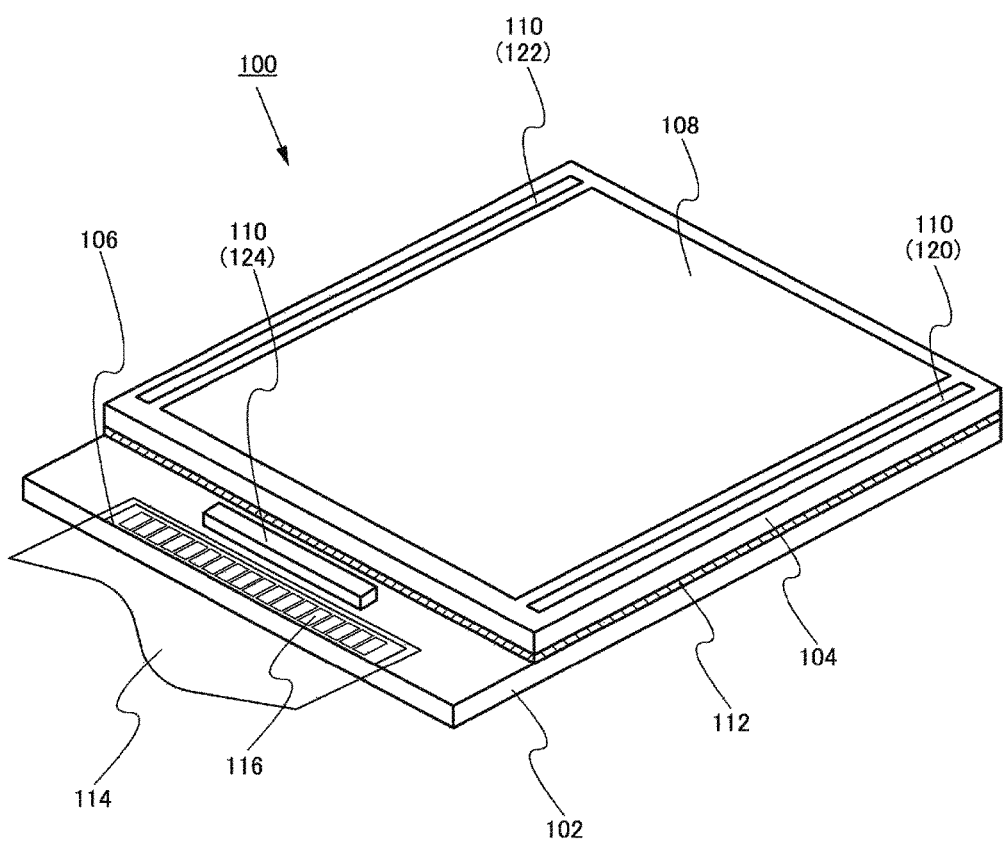
FIG. 1 is a diagram showing a structure of a semiconductor device related to one embodiment of the present invention.

Embodiments of the present invention will hereinafter be described with reference to the drawings. The present invention can be implemented according to many different embodiments, and is not intended to be interpreted by being limited to description contents of the embodiments illustrated below. While the width, the thickness, the shape, and the like of each of portions may be more schematically represented than those in an actual form to make the description clearer, this is only one example, and is not intended to limit the interpretation of the present invention. In the present specification and the drawings appended thereto, similar elements to those described above with reference to the already illustrated drawing may be assigned the same reference signs or similar reference signs (reference signs having a, b, etc. added after numbers) to omit detailed description, as needed. Further, characters having "first", "second", etc. added to elements are used for reference only to distinguish the elements, and do not means more than that unless otherwise particularly described.

In the present specification, in the case where certain parts or regions are given as [above (or below)] other parts or regions, as long as there is no particular limitation, these include parts which are not only directly above (or directly below) other parts or regions but also in an upper direction (or lower direction), that is, other structure elements may be included between other parts or regions in an upper direction (or lower direction). Furthermore, in the explanation below, as long as there is no particular limitation, the side arranged with a second substrate with respect to a first substrate in a cross-sectional view is referred to as [above] or [upper direction] and the reverse is referred to as [below] or [lower direction].

A terminal in a terminal part of a semiconductor device has a structure in which a transparent conductive layer such as indium oxide is arranged above a metal layer such as aluminum (Al). A metal layer in a terminal part is protected from corrosion due to acid and the like by being covered by a transparent conductive layer. However, since the structure of a terminal part is complex, it becomes a problem when a metal layer is not sufficiently covered by a transparent conductive layer.

For example, in the case of a structure where a metal layer is an aluminum (Al) layer which is sandwiched above and below by a titanium (Ti) layer, a problem arises whereby the side surface of the aluminum (Al) layer cannot be covered by a transparent conductive layer. Due to a difference in etching rates between an aluminum (Al) layer and a titanium (Ti) layer, in a cross-sectional shape of a metal layer, the titanium (Ti) layer protrudes to the exterior side of the aluminum layer in a peak shape. In this case, the aluminum (Al) layer below the peak caused by the titanium (Ti) has a shape that cannot be sufficiently covered by a transparent conductive film. As a result, in processes after formation of a terminal part, an aluminum layer (Al) in the terminal part receives damage which is a problem.

In order to prevent this, covering a side surface of the terminal part using a planarized film made from an organic resin has been examined. However, since a planarized film made from an organic resin has poor adhesion it becomes easy to peel away which is a problem.

A semiconductor device is provided with improved adhesion of a terminal part according to one embodiment of the present invention. The semiconductor device related to one embodiment of the present invention is explained in detail below.

1. Summary of Semiconductor Device

The semiconductor device related to one embodiment of the present invention includes a semiconductor element and at least a first terminal and a second terminal which are input with a signal for driving the semiconductor element above a substrate. FIG. 1 shows a structure of a semiconductor device 100. The semiconductor device 100 is arranged with a drive circuit part 110 (in FIG. 1, a first drive circuit 120, a second drive circuit 122 and a third drive circuit 124 are included as the drive circuit part 110), a pixel region 108 and a terminal region 106. The drive circuit part 110 and pixel region 108 are formed by a circuit including semiconductor elements. A second substrate 104 is arranged opposing the first substrate 102 so as to seal the pixel region 108. The first substrate 102 and second substrate 104 are fixed by a sealing material 112 surrounding the pixel region 108.

The terminal region 106 is a side end part of the first substrate 102 and is arranged in a region which is not sealed by the second substrate 104. The terminal region 106 is formed by a plurality of terminals 116. The terminal region 106 is connected with a wiring substrate 114 by an anisotropic conductive film. The wiring substrate 114 achieves a connection between other functional circuits or external devices and the semiconductor device 100 and is used for sending and receiving signals.

The semiconductor device 100 operates while the wiring substrate 114 is attached. Although usually this would not cause damage, in the case where repair and inspection of the semiconductor device is necessary, it is likely that the wiring substrate 114 will have to be removed from the terminal region 106. Since the wiring substrate 114 is adhered with the terminal region 106 by an anisotropic conductive film, when the wiring substrate 114 peels away, adhesion strength which can withstand peeling of the terminal region 106 is demanded. According to one embodiment of the present invention, a semiconductor device 100 including a terminal region 106 which can satisfy this demand is provided.

Figure 2:
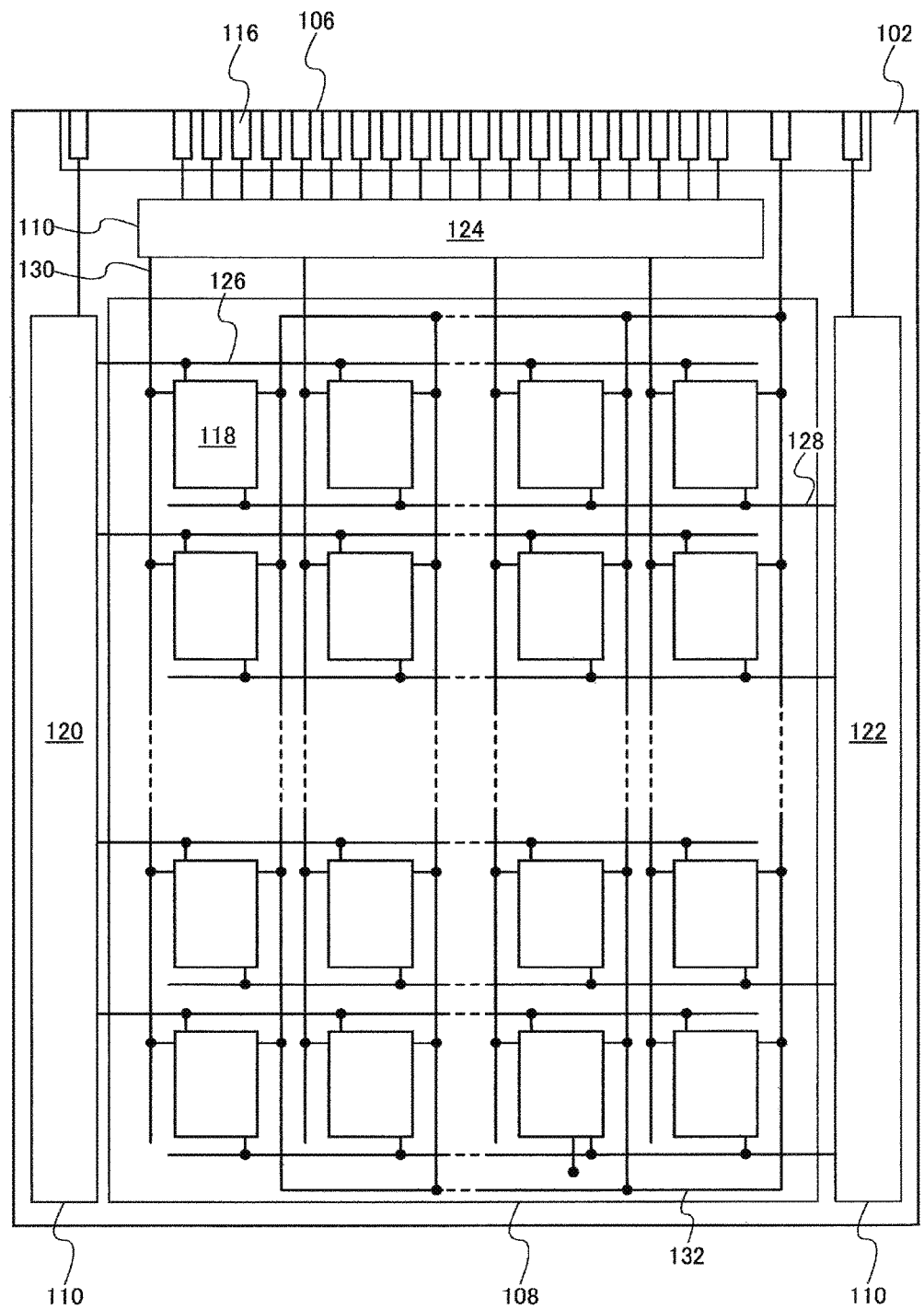
FIG. 2 is a diagram showing a structure of a semiconductor device related to one embodiment of the present invention.

FIG. 2 shows a form of the first substrate 102 in the semiconductor device 100. Each of the plurality of terminals 116 arranged in the terminal region 106 is arranged spaced apart. Furthermore, the arrangement of the terminal region 106 is not limited to the arrangement shown in FIG. 2. For example, the terminal region 106 may be arranged separated into a plurality of sections in the first substrate 102 or may arranged in an interior side region instead of an end part of the first substrate 102.

A plurality of pixels 118 is arranged in the pixel region 108. The pixels 118 are arranged in a row direction and a column direction. Although the number of rows and columns is arbitrary, for example m number of pixels 118 are arranged in a row direction (X direction) and n number of pixels 118 are arranged in a column direction (Y direction). The pixel 108 is arranged with a first scanning signal line 126 and a second scanning signal line 128 in a row direction and a video signal line 130 in a column direction. In addition, a power supply line 132 is arranged in the pixel region 108. Furthermore, although the pixels 118 are shown arranged in a square shape in FIG. 2, the present invention is not limited to this shape and a delta arrangement or other arrangement shape can be applied.

The drive circuit part 110 includes the first drive circuit 120, second drive circuit 122 and third drive circuit 124. The first drive circuit 120 outputs a signal to the first scanning signal line 126, the second drive circuit 122 outputs a signal to the second scanning signal line 128, and the third drive circuit 124 outputs a signal to the video signal line 130. A control signal which operates the first drive circuit 120, second drive circuit 122 and third drive circuit 124 is input to each of the terminals 116 in the terminal region 106. In addition, a terminal connected with the power supply line 132 extending to the pixel region 108 is included in the terminal region 106. Furthermore, the structure of the first substrate 102 shown in FIG. 2 is only an example and the structure of the drive circuit part, the scanning line, video signal line and power supply line are arbitrary and other structures may be included.

2. Structure of Terminal Region Part 1

Figure 3:
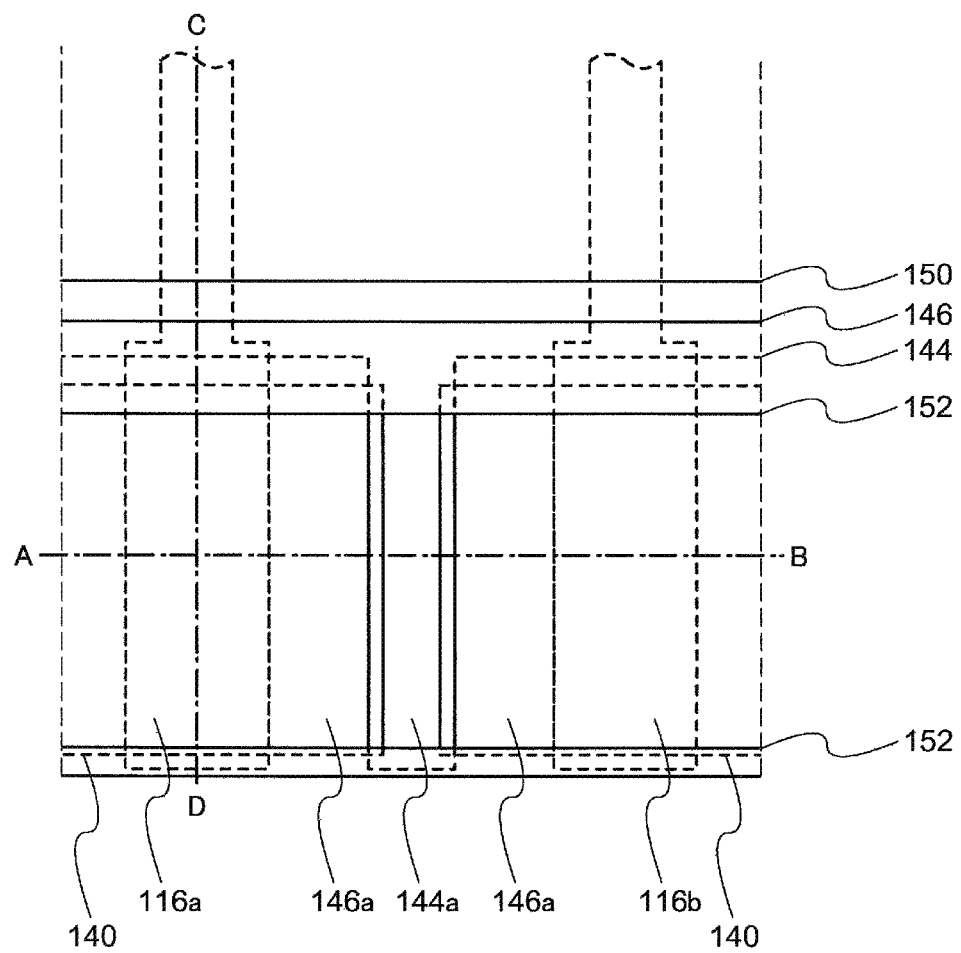
FIG. 3 is a planar view diagram showing a structure of a terminal part of a semiconductor device related to one embodiment of the present invention.
Figure 4A:
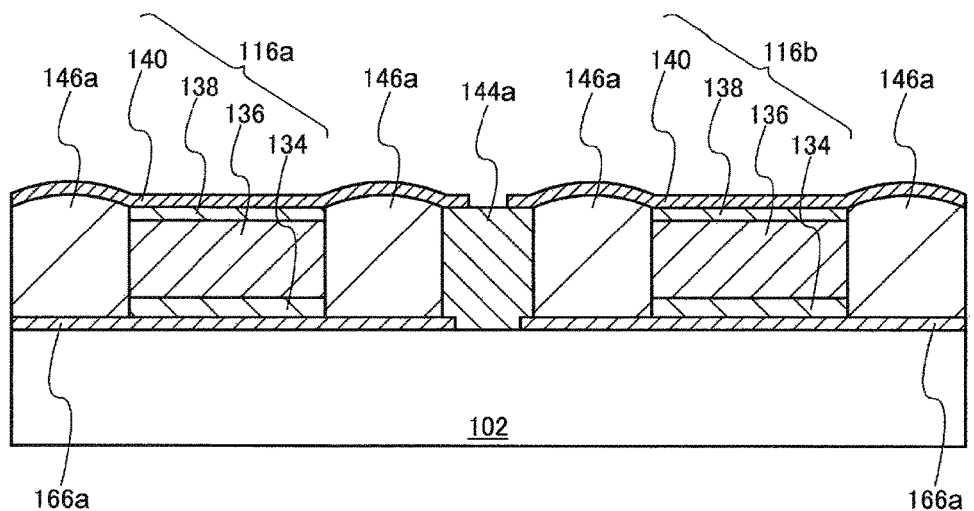
FIG. 4A is a cross-sectional diagram showing a structure corresponding to the line A-B shown in FIG. 3 in a terminal part of a semiconductor device related to one embodiment of the present invention.
Figure 4B:
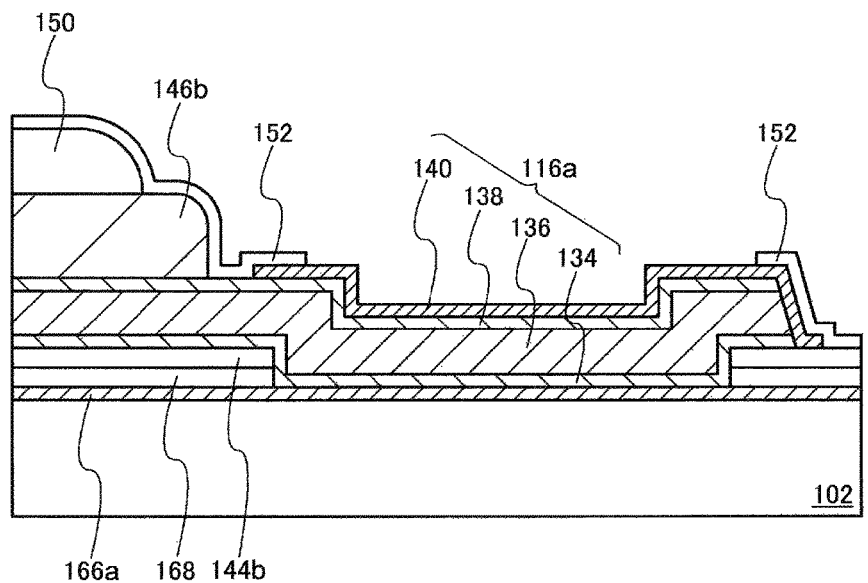
FIG. 4B is a cross-sectional diagram showing a structure corresponding to the line C-D shown in FIG. 3 in a terminal part of a semiconductor device related to one embodiment of the present invention.

The structure of the terminal region 106 is explained while referring to FIG. 2 and FIG. 4A and FIG. 4B. FIG. 3 shows a planar view diagram of two terminals (first terminal 116a, second terminal 116b) included in the pixel part 106. In addition, a vertical cross-sectional structure corresponding to the lines A-B and C-D shown in FIG. 3 is shown in FIG. 4A and FIG. 4B.

FIG. 3 shows the first terminal 116a and second terminal 116b included in the terminal region 106. The first terminal 116a and second terminal 116b are arranged in series spaced apart via a gap. A plurality of insulation layers is arranged in a gap part between the first terminal 116a and second terminal 116b. Specifically, a first insulation layer 114a is arranged in the gap part between the first terminal 116a and second terminal 116b. Furthermore, a second insulation layer 146a is arranged in the gap part between the first terminal 116a and second terminal 116b. The second insulation layer 146a is arranged in a side surface of the first terminal 116a and second terminal 116b. That is, at least one first insulation layer 144a and two second insulation layers are arranged in the gap part between the first terminal 116a and second terminal 116b. In other words, the first insulation layer 144a is arranged between the first terminal 116a and second terminal 116b and the second insulation layer 146a is arranged on both side of the first insulation layer 144a.

FIG. 4A shows the details of the first terminal 116a, second terminal 116b, first insulation layer 144a and second insulation layer 146a in a cross-sectional structure. The first terminal 116a and second terminal 116b have a structure in which a plurality of conductive layers is stacked. FIG. 4A shows a structure in which a first conductive layer 134, second conductive layer 136, third conductive layer 138 and a further fourth conductive layer 140 are stacked as the first terminal 116a and second terminal 116b. The first conductive layer 134 is formed using a conductive material with good adhesion with a ground surface in order to prevent peeling of a terminal. The second conductive terminal 136 is formed in a relatively thickly compared to other layers by selecting a material having lower electrical conductivity among conductive materials in order to reduce electrical resistance in a terminal. The third conductive layer 138 is formed above the second conductive layer 136 and is arranged in order to protect the second conductive layer 136. The fourth conductive layer 140 is arranged so as to cover the third conductive layer 138. The fourth conductive layer 140 serves a contact surface with an anisotropic conductive film or probe and the like and is formed using a harder conductive material than the second conductive layer 136.

The first conductive layer 134 and third conductive layer 138 are formed by selecting a metal material such as titanium (Ti) having a high melting point, molybdenum (Mo), tungsten (W) and tantalum (Ta). In addition, the first conductive layer 134 and third conductive layer 138 may also be formed by an alloy material using the previously mentioned metal elements such as molybdenum (Mo)—tungsten (W). For example, the first conductive layer 134 and third conductive layer 138 are formed by a metal material of tungsten (Ti), molybdenum (Mo). By using such metal materials as the first conductive layer 134 and third conductive layer 138, it is possible to increases adhesion with a terminal and thermal stability.

The second conductive layer 136 is formed using aluminum (Al) or copper (Cu) or a metal material obtained by adding a certain amount of another element to these metal elements (for example, aluminum added with titanium). Since a metal material such as aluminum (Al) or copper (Cu) has a low resistivity compared to the high melting point metal materials mentioned previously, it is possible to reduce electrical resistance of a terminal 116 and wiring connected to a terminal 116. On the other hand, since the surface of an aluminum film or copper film is easily oxidized, when a terminal 116 is formed just with such a film, there is a danger that contact resistance will increase. As a result, an oxide film is prevented from being formed by arranging the third conductive layer 138 on the upper surface of the second conductive layer 136, and a contact surface of a terminal is prevented from being insulated.

The fourth conductive layer 140 is used as a transparent conductive film, and a metal oxide such as indium tin oxide or indium zinc oxide is used. A transparent conductive film formed using these types of metal oxides is hard compared to aluminum or copper and even in the case where a terminal 116 is contacted with an anisotropic conductive film or probe, it is possible to prevent cuts or modifications (depressions) being formed in a surface of a terminal.

Furthermore, although a structure is included in the present embodiment in which four layers are stacked as the structure of the terminal 116, the present invention is not limited to this structure. The terminal 116 may also be formed by adding further conductive layers. In addition, the first conductive layer 134 may also be omitted. Alternatively, the first conductive layer 134 and third conductive layer 138 may be omitted.

The terminal 116 is formed in the same process as wiring formed in the drive circuit part 110 and pixel region 108 and may also have the same structure. As is shown in FIG. 4B, the terminal 116 may also be formed by extending a wiring layer arranged above the first insulation layer 144b. This type of structure is preferred since it is possible to omit the terminal part 116 and a contact part with wiring connected to the terminal 116.

The first insulation layer 144a is arranged between the first terminal 116a and second terminal 116b. The first insulation layer 144a is arranged in a gap part in which the first terminal 116a and second terminal 116b are arranged in series. The first insulation layer 144a does not directly contact both the first terminal 116a and second terminal 116b. The first insulation layer 144a is formed using an inorganic insulation material. Silicon oxide, silicon nitride and silicon oxynitride and the like are examples of the inorganic insulation material.

The first insulation layer 144a is preferred to be arranged along one edge of a terminal in a region between the first terminal 116a and second terminal 116b. The first insulation layer 144a may also be arranged alone between terminals. In addition, the first insulation layer 144a may be arranged in roughly the entire surface of the first substrate 102 and may be processed into a shape having a projection part sandwiched by the first terminal 116a and second terminal 116b in the terminal region 106. That is, in the terminal region 106 of the first substrate 102, the first insulation layer 144a may be selectively removed and processed so as to remain between the first terminal 116a and second terminal 116b. By forming the first insulation layer 144a arranged in the terminal region 106 from an insulation layer (interlayer insulation layer) formed above the first substrate 102, manufacturing processes are simplified and manufacturing costs are reduced.

The second insulation layer 146a is arranged between the first terminal 116a and first insulation layer 144a and between the second terminal 116b and first insulation layer 144a. The second insulation layer 146a is arranged so as to fill the space between the first terminal 116a and first insulation layer 144a and between the second terminal 116b and first insulation layer 144a. The second insulation layer 146a is arranged contacting a side surface of the first terminal 116a and the second terminal 116b. In other words, the side surface of the first terminal 116a and second terminal 116b are covered by the second insulation layer 146a. It is preferred that the second insulation layer 146a covers at least a side surface of the second conductive layer 136. By arranging the second insulation layer 146a in this way, it is possible to protect the side surface of the first terminal 116a and second terminal 116b. That is, in processes after formation of the terminal region 106, even if the first substrate 102 is exposed to a gas or chemical liquid which corrodes the second conductive layer 136, it is possible to protect the first terminal 116a and second terminal 116b from corrosion.

The second insulation layer 146a is beneficial when the second conductive layer 136 in the first terminal 116a and second terminal 116b is aluminum (Al) or a metal material with aluminum (Al) as the main component. Aluminum (Al) is etched by a mixed acid (mixed acid solution containing phosphoric acid, acetic acid and nitric acid and the like). Therefore, even if the upper surface of the second conductive layer 136 is covered by the third conductive layer 138 which is a metal such as titanium (Ti) or molybdenum (Mo), it is etched by the mixed acid when the side surface is exposed. As a measure to prevent this, it is possible to protect the second conductive layer 136 by adopting a structure in which the side surfaces of the first terminal 116a and second terminal 116b are covered by the second insulation layer 146a.

The second insulation layer 146a is preferred to be formed from an organic insulation material in order to cover the side surfaces of the first terminal 116a and second terminal 116b. The second insulation layer 146 can be manufactured by coating a solution including a precursor of an organic insulation material. By using a precursor of an organic insulation material having fluidity when forming the second insulation layer 146, it is possible to obtain a shape which covers the side surfaces of the first terminal 116a and second terminal 116b. It is possible to use a material such as polyimide or acrylic and the like as the organic insulation material. For example, in the case of polyimide, after coating a solution using a polyimide acid, it is possible to perform imidization by a thermal treatment to form a polyimide layer as the second insulation layer 146a.

The fourth conductive layer 140 is arranged above the third conductive layer 138 of each of the first terminal 116a and second terminal 116b. The fourth conductive layer 140 extends from the upper surface of the third conductive layer 138 along the upper surface of the second insulation layer 146a. The fourth conductive layer 140 is also preferred to be arranged so as to contact the upper surface of the first insulation layer 144a. In other words, in each of the terminals, the fourth conductive layer 140 which is electrically connected with the conductive layer 138 is divided above the first insulation layer 144a and adjacent fourth conductive layers 140 are electrically separated.

The terminal 116, first insulation 144a and second insulation layer 146a are arranged in the terminal region 106. These are arranged as parts each having different materials. The first insulation layer 144a has excellent adhesion with the first substrate 102. On the other hand, although the second insulation layer 146a is useful for covering a side surface part of a terminal 116, adhesion with a ground surface is sometimes low compared to the first insulation layer 144a. However, the fourth conductive layer 140 which is formed from a transparent conductive film of ITO or IZO and the like has excellent adhesion with the third conductive layer 138 formed from a metal material such as titanium (Ti) or molybdenum (Mo). In addition, the fourth conductive layer 140 has excellent adhesion with the first insulation layer 144a which is formed from an inorganic insulation material such as silicon oxide or silicon nitride. By covering the second insulation layer 146a with the fourth conductive layer 140 which has excellent adhesion with the third conductive layer 138 and first insulation layer 144a, it is possible to increase adhesion of the terminal region 106. That is, even when adhesion of the second insulation layer 146a is low, it is possible to prevent peeling of the terminal region 106 by arranging the fourth conductive layer 140 to cover the first insulation layer 144a, second insulation layer 146a and third conductive layer 138. In this way, even when the terminal region 106 and a wiring substrate are connected via an anisotropic conductive film, it is possible to securely achieve an electrical connection.

As is shown in FIG. 4A and FIG. 4B, a semiconductor layer 166a may be arranged on a ground surface of the first terminal 116a and second terminal 116b. It is possible to improve adhesion by arranging the semiconductor layer 166a in a region corresponding to a ground surface of the first conductive layer 134. The semiconductor layer 166a arranged in the terminal region 106 is used as a ground layer and can be utilized for improving adhesion of a terminal 116. Since the semiconductor layer 166a has conductivity, although it is arranged separately for each terminal, it may also spread as far as a part of the second insulation layer 146a and first insulation layer 144a.

According to the present embodiment, it is possible to reduce the area taken up by an organic insulation layer in a terminal region 106, sandwich a region of the second insulation layer 146a which is formed by an organic insulation material having low adhesion with a ground surface between the terminal part 116 which has high adhesion and the first insulation layer 144a which is formed from an inorganic insulation layer, and also obtain a structure in which an upper surface part of these layers is covered by the fourth conductive layer 140 which is formed from a transparent conductive film.

In the terminal region 106 in the present embodiment, the area of the second insulation layer 146a having low adhesion is reduced compared to the case where the space between the first terminal 116a and second terminal 116b is completely filled by an organic insulation material such as the second insulation layer 146a by arranging the first insulation layer 144a formed with an inorganic insulation material. As a result, it is possible to improve adhesion of the terminal region 106. In addition, by covering an upper surface of the second insulation layer 146a with the conductive layer 140 and sandwiching using a region in which the fourth conductive layer 140 and third conductive layer 138 having excellent adhesion are in contact and a region in which the fourth conductive layer 140 and first insulation layer 144a are in contact, it is possible to prevent peeling of the second insulation layer 146a and increase reliability of the terminal region 106. In this way, it is possible to perform repair after the semiconductor device 100 is installed in each type of device.

3. Structure of Pixel Part 1

Figure 5:
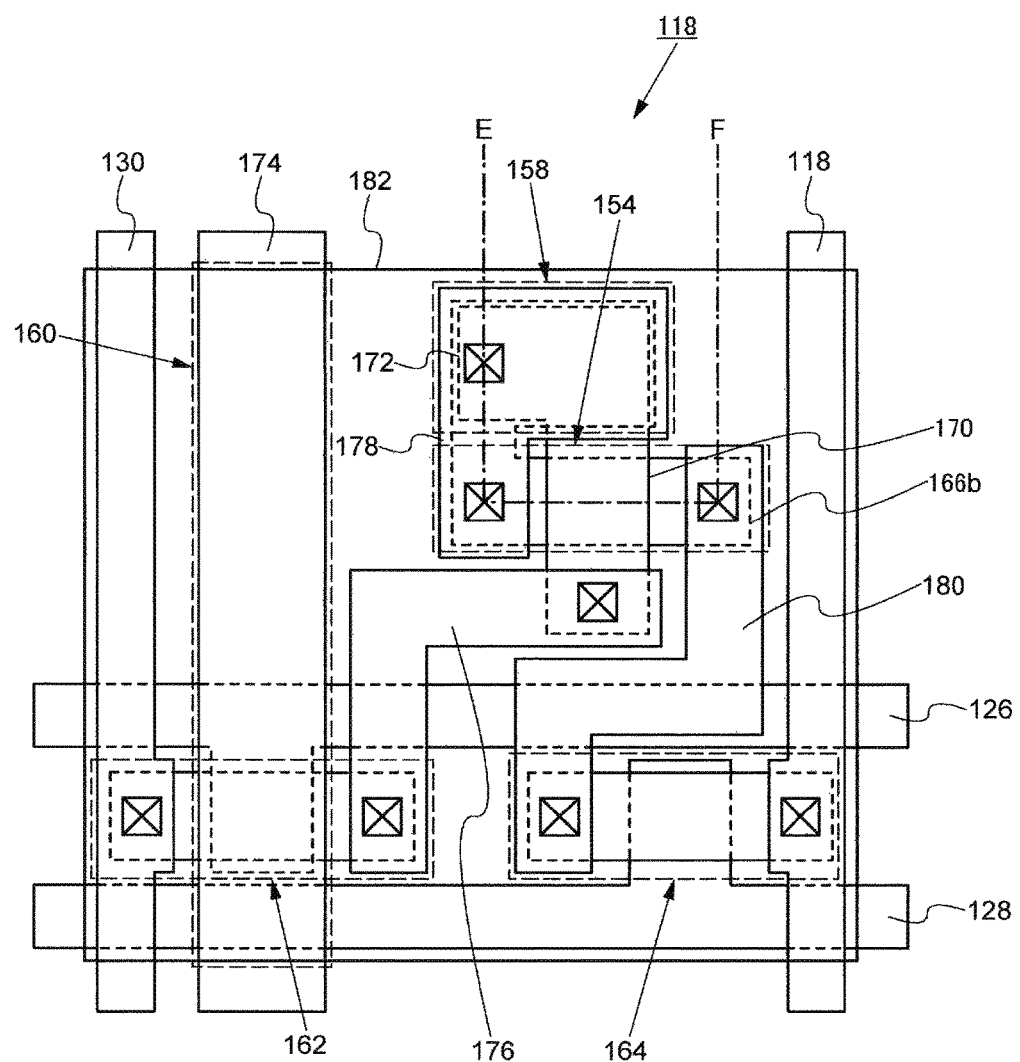
FIG. 5 is a planar view diagram showing a layout of a pixel of a semiconductor device related to one embodiment of the present invention.
Figure 6:
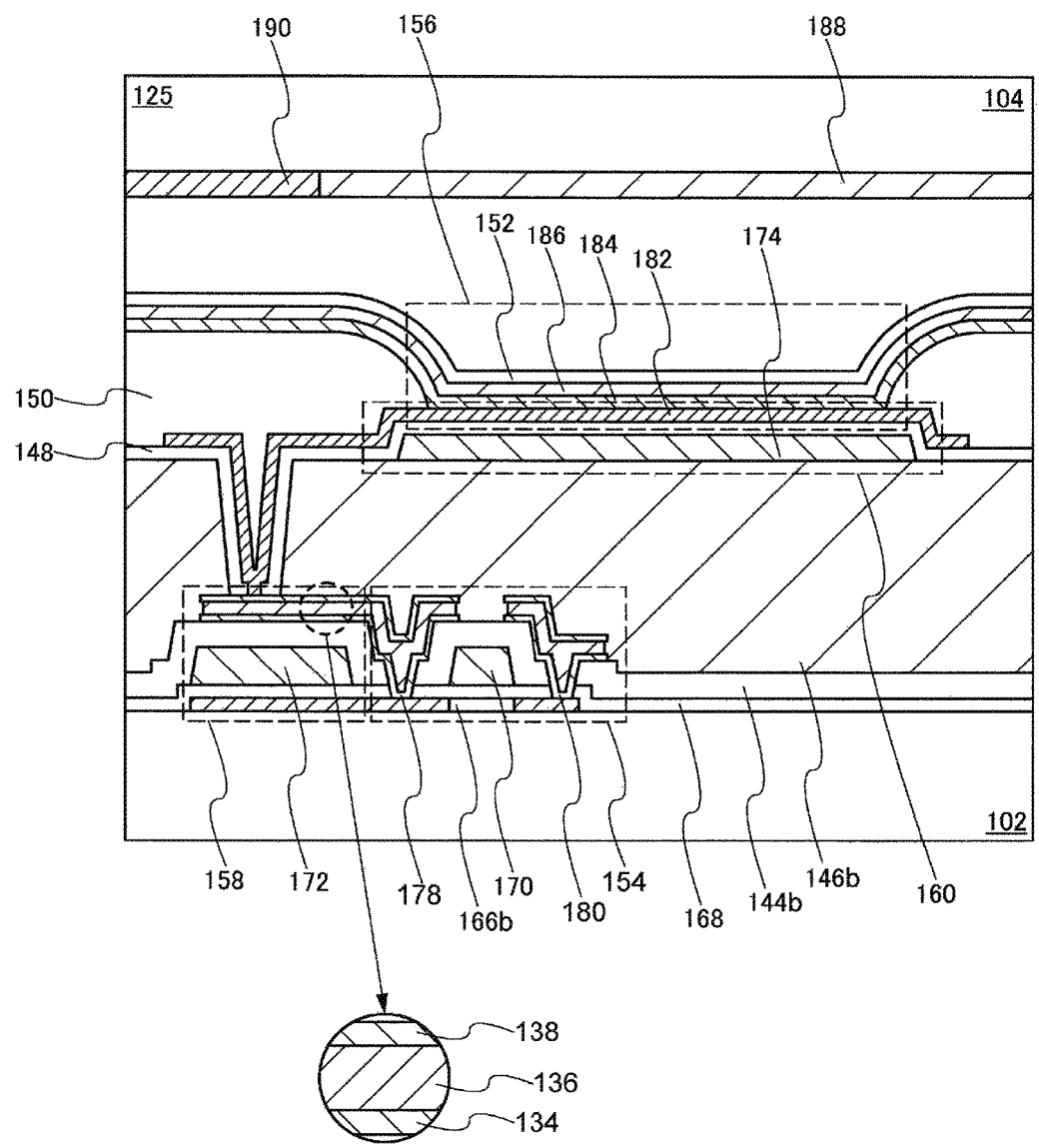
FIG. 6 is a cross-sectional diagram showing a structure of a pixel of a semiconductor device related to one embodiment of the present invention.

FIG. 5 shows an example of the pixel region 108 arranged in the semiconductor device 100. FIG. 5 shows a plan layout of a pixel 118 and a cross-sectional structure along the line E-F is shown in FIG. 6. The structure of a pixel 118 is explained below while referring to FIG. 5 and FIG. 6.

A pixel 118 is formed in a gap part in which the first substrate 102 and second substrate 104 are arranged opposing each other. Elements such as a drive transistor 154, light emitting element 156, storage capacitor element 158 and auxiliary capacitor element 160 are arranged in the first substrate 102. Light emitting parts such as a color filter 188 and light blocking layer 190 are arranged in the second substrate 104.

The drive transistor 154 is formed including a semiconductor layer 166a, gate insulation layer 168 and gate electrode 170. A drain of the drive transistor 154 is electrically connected with a second transistor 164 via a drain line 180 and a source is electrically connected with a source line 178. The source line 178 is electrically connected with a pixel electrode 182. In addition, the source line 178 includes a region in which first capacitor electrodes 172 are stacked via the first insulation layer 144b. The storage capacitor element 158 is formed by a region in which the source line 178 and first capacitor electrode 172 overlap. The first capacitor electrode 172 is formed in the same layer as the gate electrode 170. The gate electrode 170 of the drive transistor 154 is electrically connected with the first transistor 162 via the gate line 176. A gate electrode of the first transistor 162 is electrically connected with a first scanning signal line 126 and either a source or drain is electrically connected with a video signal line 130. A second transistor 164 is arranged with a gate electrode so as to electrically connect with a second scanning signal line 128 and either a source or drain is electrically connected with a power supply line 132.

In the cross-sectional structure shown in FIG. 6, the first insulation layer 144b is arranged between the gate electrode 170, and the source line 178 and drain line 180. The second insulation layer 146b is arranged between the source line 178 and drain line 180, and the pixel electrode 182 The first insulation layer 144a and second insulation layer 146b include a function of an interlayer insulation film for insulating wires. The first insulation layer 144b is formed from an inorganic insulation material. On the other hand, the second insulation layer 146b is formed from an organic insulation material. The second insulation layer 146b is used as a planarized film for planarizing an upper surface of a side arranged with the pixel electrode 182.

The source line 178 and drain line 180 arranged in upper layer of the first insulation layer 144b include a structure in which the first conductive layer 134, second conductive layer 136 and third conductive layer 138 are stacked as is shown by the expanded view inserted in FIG. 6. When the cross-sectional structure of a pixel 118 shown in FIG. 6 is compared with the cross-sectional structure of the terminal region 106 shown in FIG. 4A and FIG. 4B, the first terminal 116a and second terminal 116b use the same material parts as the source line 178 and drain line 180. In addition, the first insulation layer 144 and second insulation layer 146 are used as common parts.

The light emitting element 156 is formed by a pixel electrode 182, organic layer 184 and opposite electrode 186. A fifth insulation layer 152 is arranged as a passivation layer on an upper surface of the light emitting element 156. The auxiliary capacitor element 160 has a structure in which the pixel electrode 182, third insulation layer 148 and second capacitor electrode 174 are stacked. The pixel electrode 182 is enclosed by the fourth insulation layer 150. The fourth insulation layer 150 has an aperture part and the pixel electrode 182 is exposed by the aperture part. An organic layer 184 is arranged above the pixel electrode 182. The organic layer 184 is formed by one or a plurality of layers and includes an organic electroluminescent material. The light emitting element 156 emits light when a voltage above a light emitting threshold voltage is applied between the pixel electrode 182 and opposite electrode 186. In the present embodiment, the pixel electrode 182 is applied with a structure in which light emitted by the organic layer 184 is reflected due to the stacked structure of a transparent conductive film and metal film. For example, the pixel electrode 182 has at least two transparent conductive films and a metal film (for example, a metal with high reflectance such as silver (Ag) or aluminum (Al) is preferred) sandwiched by these two transparent conductive films. Since the opposite electrode 186 is formed from a transparent conductive film and allows light emitted by the organic layer 184 to pass through, the light emitting element 156 emits light to the side of the second substrate 104.

Figure 7:
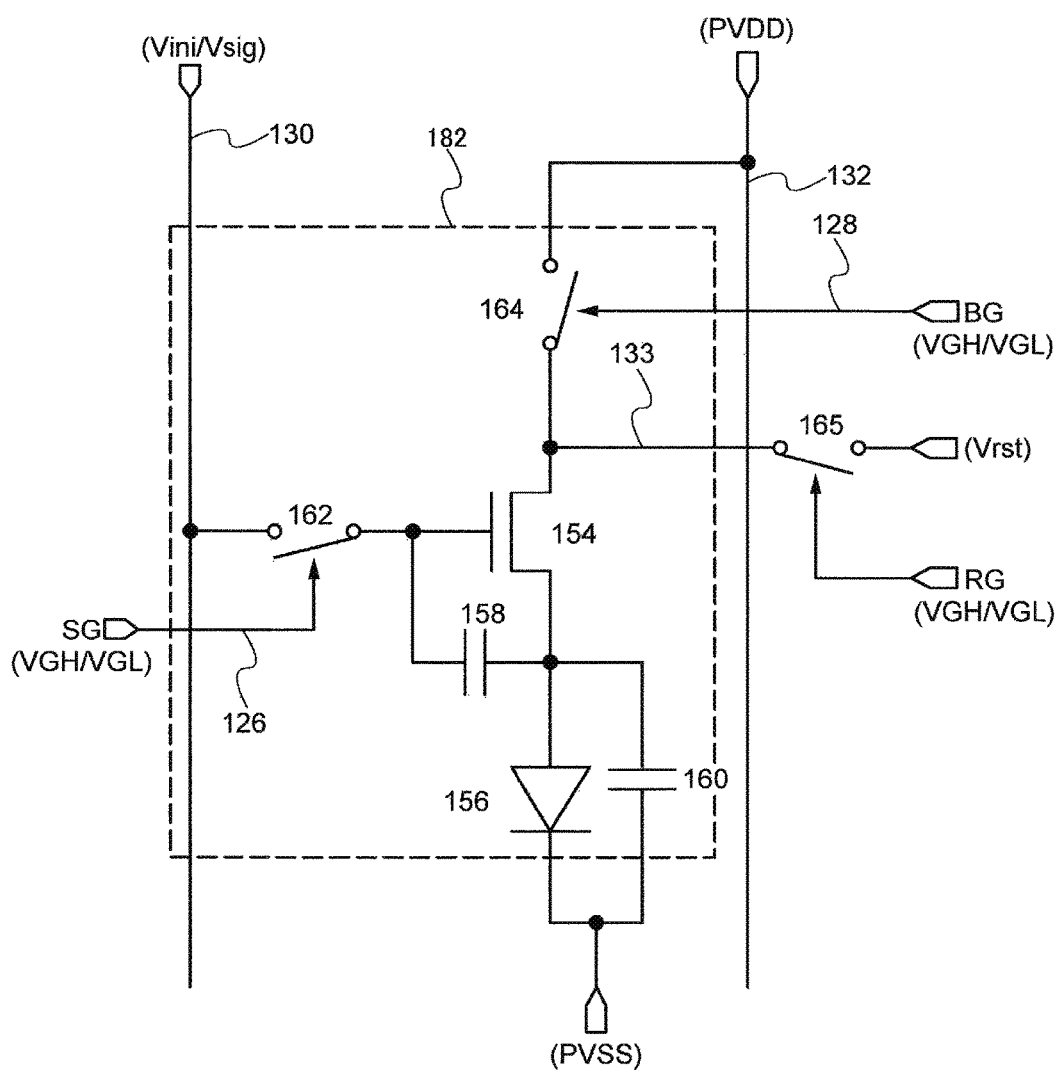
FIG. 7 is a diagram showing an equivalent circuit of a pixel of a semiconductor device related to one embodiment of the present invention.

An equivalent circuit of a pixel shown in FIG. 5 is shown in FIG. 7. The drive transistor 154 includes a gate as a control terminal, and a source and drain as input/output terminals. One input/output terminal corresponding to the source and drain of the drive transistor 154 is electrically connected to a power supply line 132 via a second drive transistor 164. In addition, the other input/output terminal corresponding to the source and drain of the drive transistor 154 is electrically connected to a one terminal of the light emitting element 156. Furthermore, the drive transistor 154 in the equivalent circuit in FIG. 7 is given as an n channel type. In the drive transistor 154, an input/output terminal on the side electrically connected with the power supply line 132 is given as the drain, and an input/output terminal on the side electrically connected with the light emitting element 156 is given as the source.

The gate of the drive transistor 154 is electrically connected to a video signal line 130 via the first transistor 162. An ON/OFF operation of the first transistor 162 is controlled by a controls signal SG (including amplitude VGH/VGL) provided by the first scanning signal line 126. A control signal VGH is a high voltage signal which sets the first transistor 162 to ON, and a control signal VGL is a low voltage signal which sets the first transistor 162 to OFF. When the first transistor 162 is ON, a voltage of the video signal line 130 is provided to the drive transistor 154.

The storage capacitor element 158 is arranged between the source and gate of the drive transistor 154. A gate voltage of the drive transistor 154 is controlled by the storage capacitor element 158. The light emitting intensity of the light emitting element 156 is controlled by a drain current of the drive transistor 154. In addition, the auxiliary capacitor element 160 is connected with the drain of the drive transistor 154. The auxiliary capacitor element 160 is charged by the drain current of the drive transistor 154 and the amount of light emitting current of the light emitting element 156 is adjusted. When a voltage based on a video signal is supplied to the gate of the drive transistor 154 and the second transistor 164 is switched ON, a drain current flows to the light emitting element 156 and light is emitted. In addition, a reset signal line 133 provided with a reset current via the third transistor 165 is connected to the drain side of the drive transistor 154.

According to the present embodiment, wiring or an insulation layer which form the pixel 118, and a conductive layer and insulation layer which form a terminal region 106 are each formed by a common film respectively. Therefore, since it is possible to build the pixel region 108 and terminal region 106 into the semiconductor device 100 in a common process, there is an advantage in that manufacturing processes and manufacturing costs and not significantly increased. Furthermore, the layout of a pixel shown in FIG. 5 and the equivalent circuit of a pixel shown in FIG. 7 are merely example and the present invention is not limited to these, other structures can also be applied.

4. Structure of a Terminal Region Part 2

Figure 8:
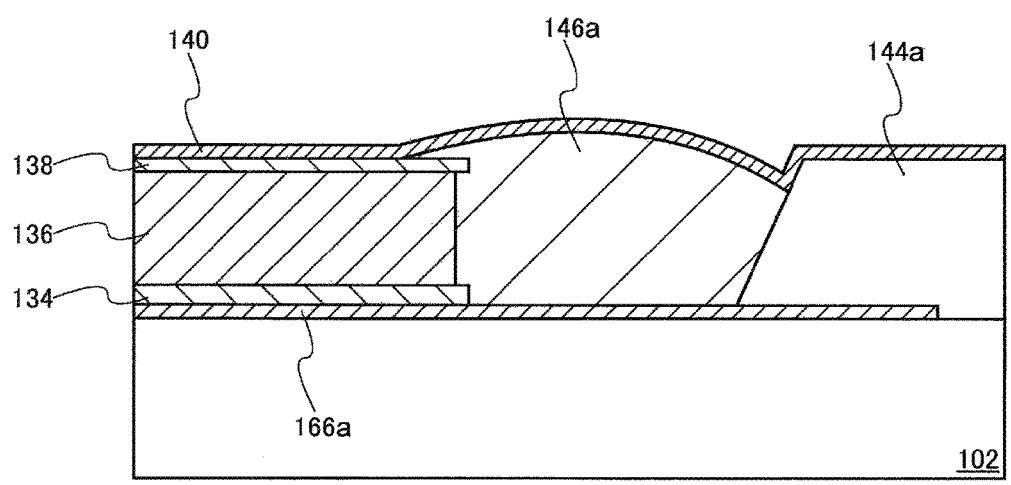
FIG. 8 is a cross-sectional diagram showing a structure of a terminal part of a semiconductor device related to one embodiment of the present invention.

FIG. 8 shows a form of a structure of the terminal region 106. The structure a terminal 116, and the first insulation layer 144a and second insulation layer 146a are the same as those explained while referring to FIG. 4A. However, in the terminal region 106 shown in FIG. 8, in addition to arranging the second insulation layer 146a to contact a side surface of the terminal part, the second insulation layer 146a is also arranged to cover a part of the upper surface (upper surface of the third conductive layer 138) of the terminal 116.

The first conductive layer 134 and third conductive layer 138 are formed from the same or same type of conductive material. For example, the first conductive layer 134 and third conductive layer 138 are formed from titanium (Ti) or molybdenum (Mo) and the second conductive layer 136 is formed from aluminum (Al). In this type of terminal 116 structure, when the etching rate of the second conductive layer 136 is higher than the etching rate of the first conductive layer 134 and third conductive layer 138, an end part of the first conductive layer 134 and third conductive layer 138 becomes a shape which projects further to the exterior side than the end part of the second conductive layer 136. A side end part of the second conductive layer 136 becomes a drawn back shape with respect to a side end part of at least the third conductive layer 138. In the peak shape of the side end part of the third conductive layer 138 which projects to the exterior with respect to the second conductive layer 136, the extent of the projection of the peak part can be changed by the etching conditions for forming the terminal 116. Although it is ideal for the terminal 116 to have a shape in which the end parts of the first conductive layer 134, second conductive layer 136 and third conductive layer 138 are in alignment, even if a peak shape is formed due to the third conductive layer 138 as is shown in FIG. 8, by burying the second conductive layer 136 into the peak shape, it is possible to compensate for the lack of step-coverage of the fourth conductive layer 140 arranged on an upper layer of the third conductive layer 138.

It is ideal to match the heights of the upper end surfaces of the third conductive layer 138 and second insulation layer 146a in order to prevent the fourth conductive layer 140 from breaking. This ideal shape requires a high level of processing precision. However, by adopting a structure in which a part of the second insulation layer 146a overlaps an upper surface side end part of the third conductive layer 138 in the terminal 116, it is possible to provide leeway to that processing precision. As is shown in FIG. 8, in the case where the second insulation layer 146a contacts an upper end part of the third conductive layer 138, it is preferred that the second insulation layer 146a include a taper shaped cross-section instead of forming a step shape. In an upper surface part of the conductive layer 138, including a taper shape where the film thickness of the second insulation layer 146a gradually increases from an end part is effective in preventing the fourth conductive layer 140 from breaking.

In a structure where the second insulation layer 146a overlaps an upper surface of the terminal 116, the ratio of a cover region of the second insulation layer 146a sandwiched by the third conductive layer 138 and fourth conductive layer 140 is less than 50% of the upper surface area of the terminal 116, preferably less than 25% and ideally 0%. When a region covered by the second insulation layer 146a is 50% or more, an upper surface of a terminal 116 becomes covered by the second insulation layer 146a arranged on both side surfaces of a terminal 116 which is undesirable. Although a structure (when a cover region ratio is 0%) in which the upper end parts of the third conductive layer 138 and second insulation layer 146a match is ideal, if the ratio of the cover region is larger than 0%, less than 50% or preferably less than 25%, it is possible to practically achieve an electrical connection with parts such as a wiring substrate and the like in an upper surface of a terminal 116.

The second insulation layer 146a is covered when the fourth conductive layer 140 is arranged from an upper surface of a terminal 116 to a part of the first insulation layer 144a. Since the fourth conductive layer 140 has excellent adhesion with the third conductive layer 138 and with the first insulation layer 144a, it is possible to prevent peeling of the second insulation layer 146a by adopting this type of structure.

Furthermore, the same as described above, the second insulation layer 146a may be arranged so as to overlap an upper surface part of the first insulation layer 144a in a side which contacts the first insulation layer 144a. That is, in a structure where the second insulation layer 146a overlaps an upper surface (except a taper shaped side wall surface) of the first insulation layer 144a, the ratio of a cover region of the second insulation layer 146a sandwiched by the first insulation layer 144a and fourth conductive layer 140 is less than 50% of the upper surface area of the first insulation layer 144a, preferably less than 25% and ideally 0%. In this way, it is possible to obtain the same effects as in the case of an upper surface of a terminal 116. In addition, as is shown in FIG. 8, an upper end part of the second insulation layer 146a may be arranged so as to contact with a side surface part of the first insulation layer 144a. In the case where a side surface of the first insulation layer 144a is inclined (when a taper shaped side wall surface is included), the fourth conductive layer 140 may be arranged from the second insulation layer 146a along a surface of the first insulation layer 144a. When a side wall of the first insulation layer 144a is inclines in a gentle taper shape, it is possible to relax the structure so that a step in a boundary part between the second conductive layer 136 and first conductive layer 134 does not become steep.

According to the form of the terminal region 106 referred to in FIG. 8, by arranging the second insulation layer 146a so as to overlap at an upper surface part of a terminal 116, it is possible to securely cover the second conductive layer 136 with the second insulation layer 146a so that the fourth conductive layer 140 does not break. In this way, it is possible to prevent the terminal 116 from peeling. As long as these effects can be obtained, the side wall of the first insulation layer 144a and a part of an upper surface of the semiconductor layer 166a do not have to be covered with the second insulation layer 146a for example. That is, it is sufficient that at least a side wall of the second conductive layer 136 is covered by the second insulation layer 146a.

5. Structure of a Pixel Part 2

Figure 9:
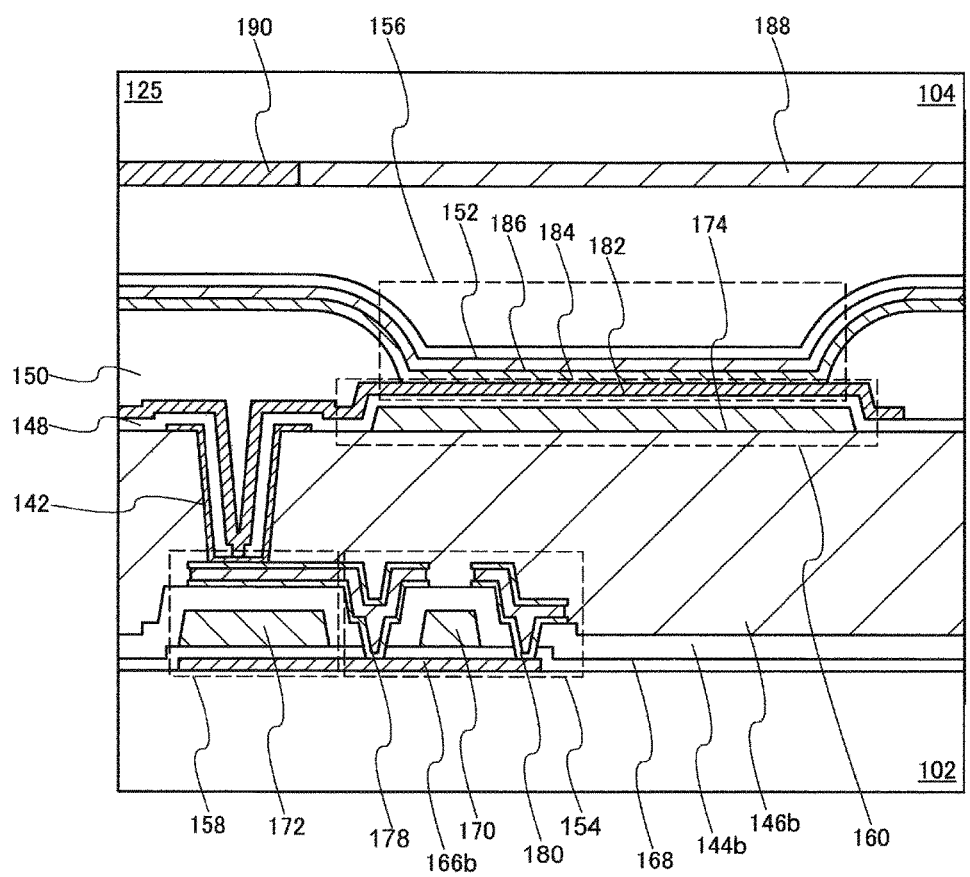
FIG. 9 is a cross-sectional diagram showing a structure of a terminal part of a semiconductor device related to one embodiment of the present invention.

FIG. 9 shows a different form of a structure of a pixel 118 to FIG. 6. The pixel shown in FIG. 9 is arranged with a fifth conductive layer 142 formed from a transparent conductive film in a contact part between a source line 178 and pixel electrode 182. By arranging a fifth conductive layer 142 in a contact part, it is possible to stabilize the shape of a contact hole and securely obtain an electrical connection between the source line 178 and pixel electrode 182.

The fifth conductive layer 142 forms a contact hole in the second insulation layer 146b and is formed after the source line 178 is exposed. The fifth conductive layer 142 can be manufactured in the same process as the fourth conductive layer 140 arranged in an upper surface of the third conductive layer in the terminal region 106. That is, it is possible to form the fourth conductive layer 140 and fifth conductive layer 142 using the same transparent conductive film.

In this way, according to the embodiment shown in FIG. 9, it is possible to prevent a terminal region 106 from peeling and securely form a contact hole in a pixel electrode in a pixel 118 without increasing the manufacturing processes and increase the reliability of the semiconductor device 100.

6. Manufacturing Process

Figure 10A:
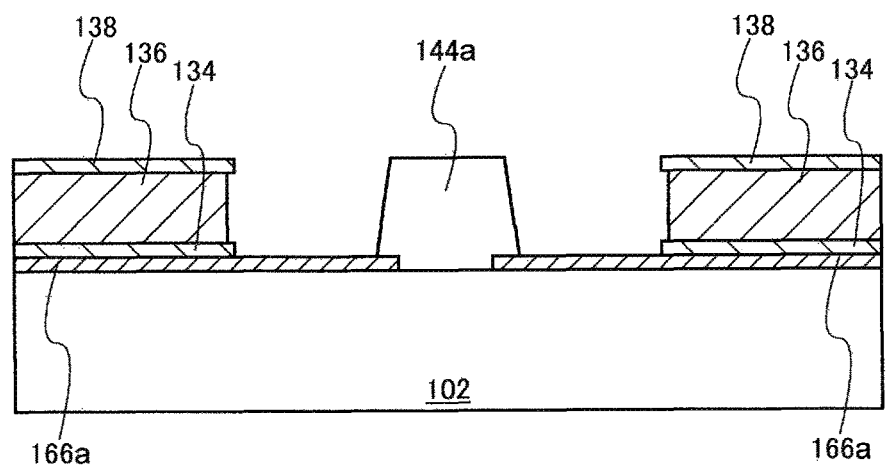
FIG. 10A is a cross-sectional diagram showing a structure of a terminal part in a manufacturing process of a semiconductor device related to one embodiment of the present invention.
Figure 10B:
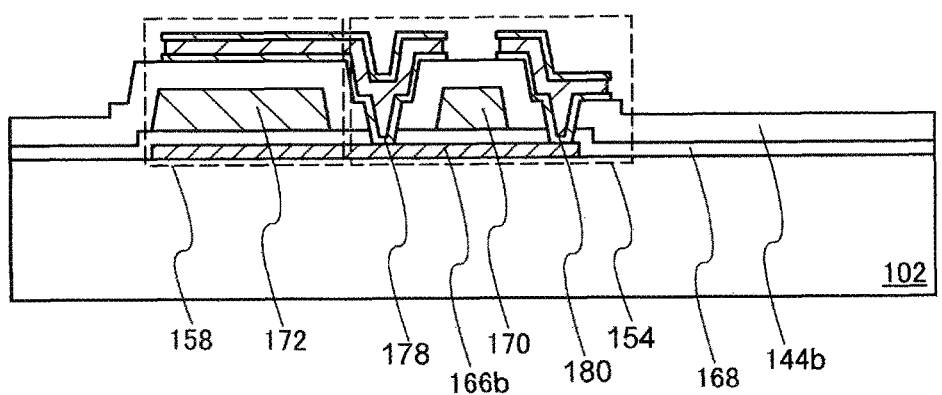
FIG. 10B is a cross-sectional diagram showing a structure of a pixel in a manufacturing process of a semiconductor device related to one embodiment of the present invention.
Figure 11A:
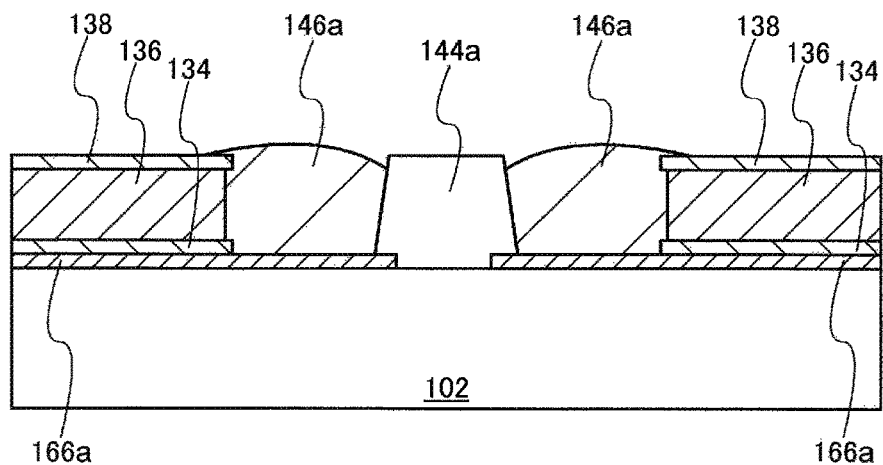
FIG. 11A is a cross-sectional diagram showing a structure of a terminal part in a manufacturing process of a semiconductor device related to one embodiment of the present invention.
Figure 11B:
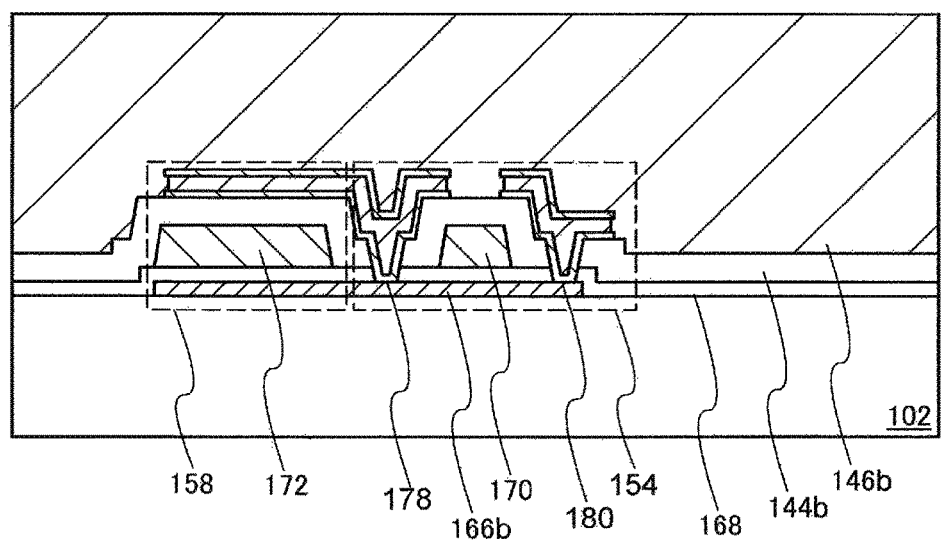
FIG. 11B is a cross-sectional diagram showing a structure of a pixel in a manufacturing process of a semiconductor device related to one embodiment of the present invention.
Figure 12A:
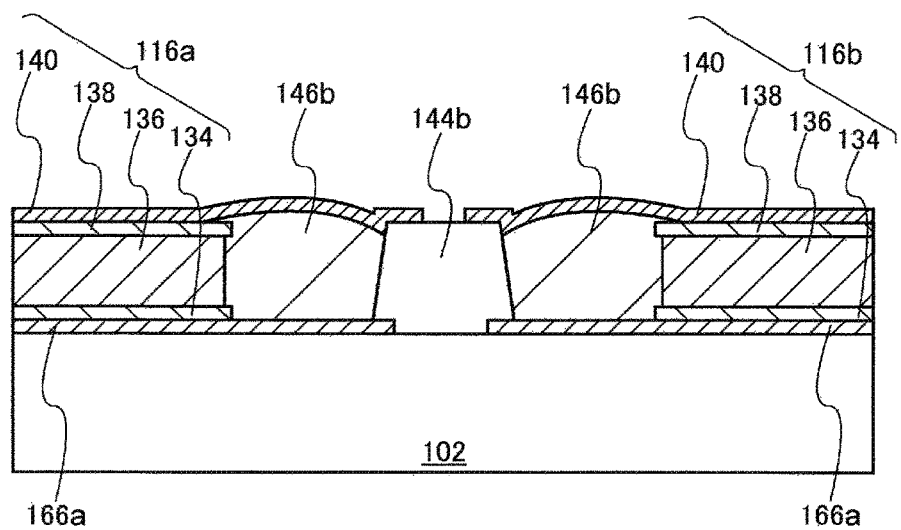
FIG. 12A is a cross-sectional diagram showing a structure of a terminal part in a manufacturing process of a semiconductor device related to one embodiment of the present invention.
Figure 12B:
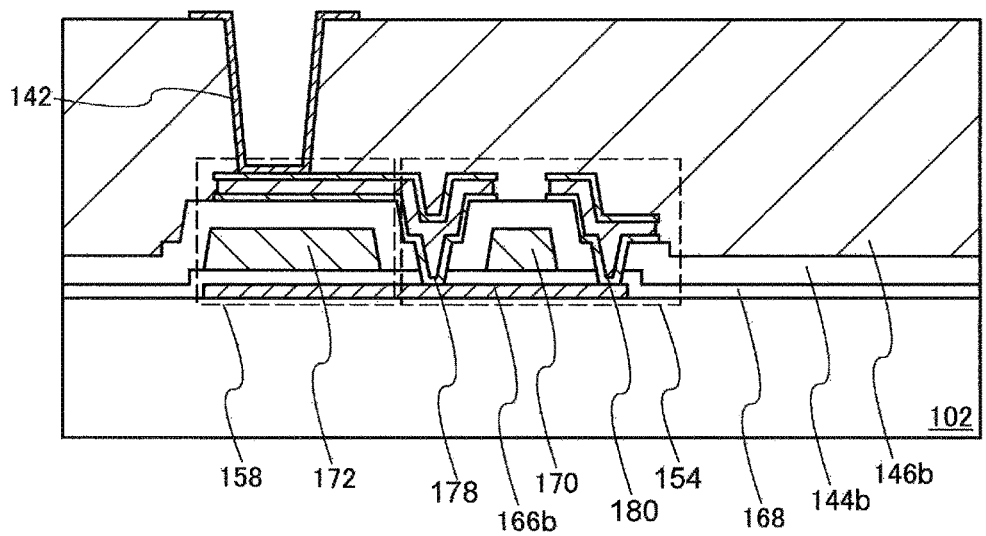
FIG. 12B is a cross-sectional diagram showing a structure of a pixel in a manufacturing process of a semiconductor device related to one embodiment of the present invention.

The manufacturing process of the semiconductor device 100 related to one embodiment of the present invention is explained while referring to FIG. 10A, 10B, FIG. 11A, 11B and FIG. 12A, 12B. Furthermore, in the drawings, FIGS. 10A, 11A, and 12A shows a schematic view of a cross-sectional structure of a terminal region 106 and FIGS. 10B, 11B, and 12B shows a schematic view of a cross-sectional structure of a pixel region 108.

FIG. 10A shows a step where a first terminal 116a and second terminal 116b are formed in the terminal region 106 and FIG. 10B shows a step where a source line 178 and drain line 180 connected to the drive transistor 154 are formed. The first insulation layer 144a is formed between the first terminal 116a and second terminal 116b in the terminal region 106. The first insulation layer 144a is formed from an inorganic insulation material in the terminal region, and the source line 178 and drain line 180 in the pixel region 108 are simultaneously processed in a process for forming a contact hole connected to the semiconductor layer 166b in the first insulation layer 144b. Since the contact hole formed in the first insulation layer 144b is formed by etching an aperture side wall surface into a taper shape, a side wall is also inclined in a taper shape in the first insulation layer 144a of the terminal region 106. Titanium (Ti) or molybdenum (Mo) are used for the source line 178 and drain line 180 as the first conductive layer 134 and third conductive layer 138 and aluminum (Al) is used as the second conductive layer 136. The first terminal 116a and second terminal 116b are both manufactured using the same structure.

FIG. 11A shows a step where the second insulation layer 146 is formed. The second insulation layer 146 is formed using an organic insulation material. It is possible to use a material such as polyimide or acrylic and the like as the organic insulation material. For example, in the case of polyimide, exposure and development are performed after drying using a polyimide acid solution to form a contact hole and the like and following this imidization by a thermal treatment is performed to form the second insulation layer 146. Since a layer formed with such an organic insulation material is coated by a spin coater or bar coater, it is formed on roughly the entire surface of the first substrate 102. As a result, the first terminal 116a and second terminal 116b and source line 178 and drain line are buried using a layer of an organic insulation material.

FIG. 12A and FIG. 12B show a step where the fourth conductive layer 140 and fifth conductive layer 142 are processed. As is shown in FIG. 12A, the fourth conductive layer 140 is formed in the terminal region 106 to cover the third conductive layer 138 exposed to an upper surface of a first terminal, and to cover the second insulation layer 146b and a part of the first insulation layer 144. At the same time, fourth conductive layer 140 is formed to cover the third conductive layer 138 exposed to an upper surface of a second terminal, and to cover the second insulation layer 146b and a part of the first insulation layer 144. On the other hand, the fourth conductive layer 140 is formed in the pixel region 108 to cover the source line 178 exposed from a contact hole which is opened beforehand.

Although patterning of the second insulation layer 146a formed in the terminal region 106 and an aperture of a contact hole formed in the pixel region 108 was explained in the processes described above, processing with respect to the second insulation layer 146 can be performed by forming a mask pattern using a photo resist and etching. However, since the processing depth of a contact hole in the pixel region 108 and the processing depth of the second insulation layer 146 in the terminal region 106 are different (it is necessary to leave the second insulation layer 146 in the terminal region 106), it is difficult to perform etching using the same mask pattern and therefore it is necessary to perform processing in two separate steps.

Figure 14A:
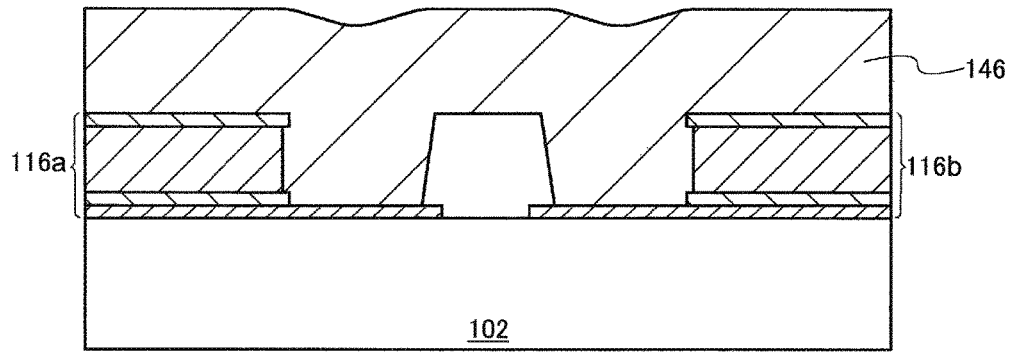
FIG. 14A is a cross-sectional diagram showing a structure of a terminal part in a manufacturing process of a semiconductor device related to one embodiment of the present invention.
Figure 14B:
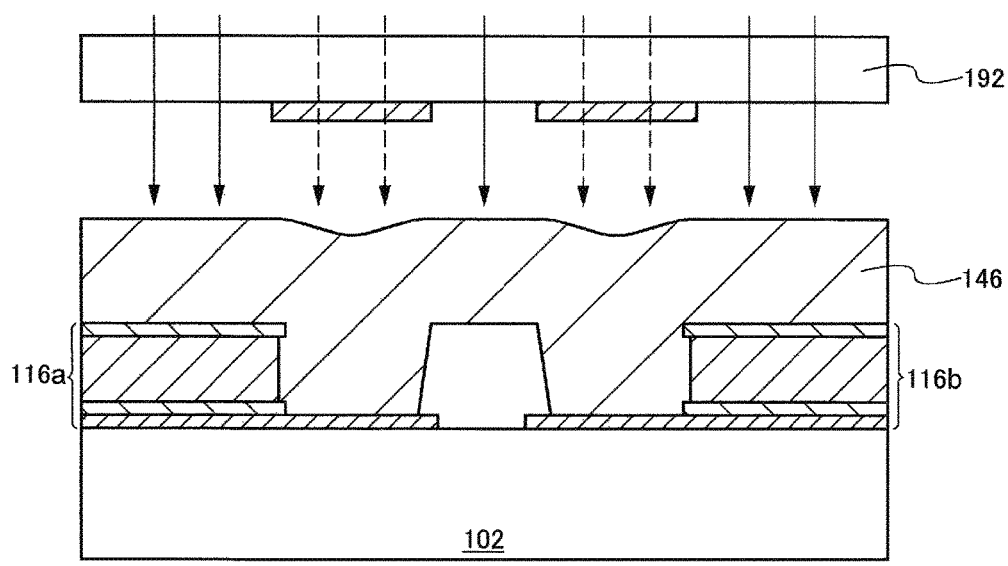
FIG. 14B is a cross-sectional diagram showing a structure of a terminal part in a manufacturing process of a semiconductor device related to one embodiment of the present invention.
Figure 14C:
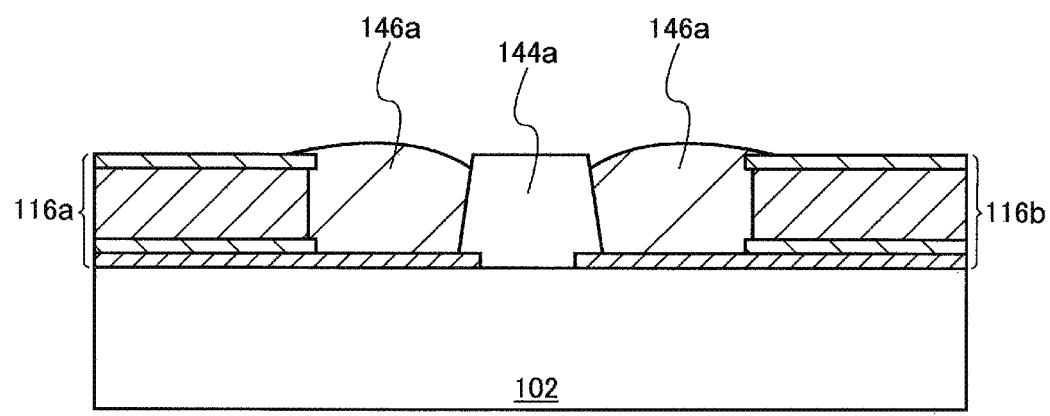
FIG. 14C is a cross-sectional diagram showing a structure of a terminal part in a manufacturing process of a semiconductor device related to one embodiment of the present invention.

On the other hand, when a photosensitive organic resin material and a halftone mask 192 used in a photolithography process are combined, it is possible to simultaneously process the second insulation layer 146 in the terminal region 106 and form a contact hole in the pixel region 108. FIGS. 14A, 14B, and 14C show a processing form in the terminal region 106.

FIG. 14A shows a step where the second insulation layer 146 is formed to a film thickness for burying the first terminal 116a, second terminal 116b and first insulation layer 144a. At this step, a photosensitive organic material is coated and semi-cured in order to form the second insulation layer 146.

FIG. 14B shows a step where an exposure process is performed using a halftone mask 192. In the case of a positive type photosensitive organic film, the photo-sensitized parts are removed by development. A region desired to be left as the second insulation layer 146 in the terminal region 106 is exposed under reduced light by the halftone mask 182 so that the amount of irradiated light is smaller than other regions. The halftone mask 192 is arranged with a semi-transparent pattern for reducing the irradiated light at a position corresponding to the second insulation layer 146.

FIG. 14C shows a state after developing an exposed photosensitive organic film and formation of the second insulation layer 146. A region between the first terminal 116a and first insulation layer 144a and a region between the second terminal 116b and first insulation layer 144a remain after exposure since they are not thoroughly exposed. The thickness of the remaining films can be adjusted by radiation light intensity and radiation time. At this step, the amount of light when exposing the organic resin layer is adjusted and a process for reducing the film thickness of the photosensitive organic film is performed so that at least a part of an upper surface of the first terminal 116a and second terminal 116b are exposed. For example, the film thickness of the second insulation layer 146a can be set to 50% or less with respect to the film thickness of the second insulation layer 146b in a pixel region using the surface of the semiconductor layer 166a below as a reference. By setting the second insulation layer 146a to this thickness, it is possible to sufficiently cover a side surface of a terminal 116. In this case, a part of the second insulation layer 146a may be arranged so as to cover a part of the upper surface of the third conductive layer 138 as was explained while referring to FIG. 8. In addition, a part of the second insulation layer 146a may be arranged so as to cover a part of the upper surface of the first insulation layer 144a as was explained while referring to FIG. 8. In either case, it is possible to process a contact hole in the pixel region 108 while reducing the film thickness of the second insulation layer 146a in the terminal region 106.

Furthermore, film thickness from a ground surface (surface of the semiconductor layer 166a) of the second insulation layer 146a in the terminal region 106 is preferred to be 50% or less of the thickness (thickness from the uppermost surface of the source line 178 or drain line 180) of the second insulation layer 146b in the pixel region 108. By setting this film thickness, it is possible to cover a side wall of a terminal 116 (in particular, side wall of the second conductive layer 136).

Figure 13A:
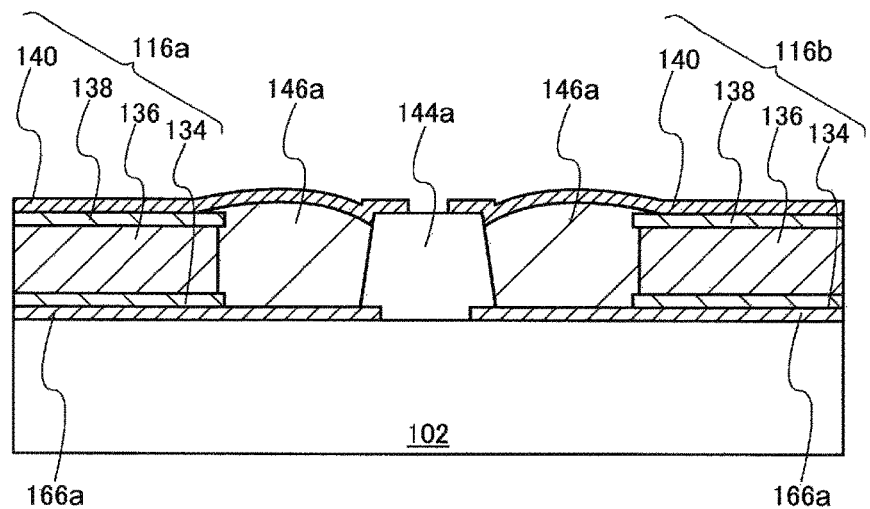
FIG. 13A is a cross-sectional diagram showing a structure of a terminal part in a manufacturing process of a semiconductor device related to one embodiment of the present invention.
Figure 13B:
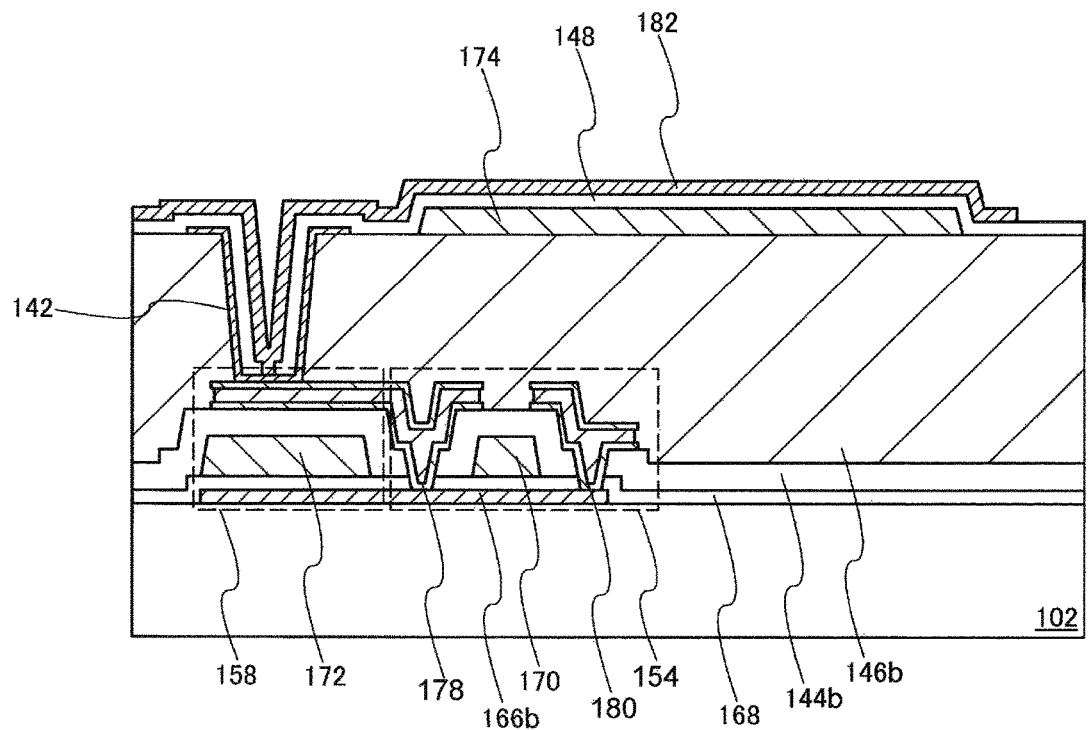
FIG. 13B is a cross-sectional diagram showing a structure of a pixel in a manufacturing process of a semiconductor device related to one embodiment of the present invention.

Following this, processing of the pixel electrode 182 is performed as is shown in FIG. 13B. The pixel electrode 182 is formed using silver (Ag) as a reflecting electrode and by a stacked structure in which an upper layer and lower layer of a silver (Ag) film sandwiches ITO. Etching is performed on the pixel electrode 182 using a mixed acid solution. In this case, as is shown in FIG. 13A, since at least a side wall of the second conductive layer 136 in the first terminal 116a and second terminal 136 is covered by the second insulation layer 146a, damage is not received even when etching is performed using mixed acid. In this way, it is possible to protect the first terminal 116a and second terminal 116b by arranged the second insulation layer 146a in a terminal region.

Following this, as is shown in FIG. 9, each element which forms a pixel 118 and the terminal region 106 are formed into the first substrate by arranging the fourth insulation layer 150 which encloses the pixel electrode 182, the organic layer 184, the opposite electrode 186 and the fifth insulation layer 152 as a passivation layer.

According to the present embodiment, it is possible to manufacture a terminal region 106 and a pixel region 108 not in separate processes but in the same process. That is, it is possible to manufacture a structure which increases reliability of a terminal region 106 in the semiconductor device 100 together with a pixel region 108 in the semiconductor device 100.

The structure of a semiconductor device related to one embodiment of the present invention can be applied to devices (display devices) having a screen region for displaying video. For example, the structure can be applied to a display device arranged with light emitting elements which use an electroluminescent material or a display device which displays video using the electrical optical effects of a liquid crystal.

What is claimed is:

1. A semiconductor device comprising:
   a substrate;
   a semiconductor layer above the substrate;
   a first terminal and a second terminal arranged above the substrate, and stacked with a first conductive layer including titanium or molybdenum, a second conductive layer including aluminum above the first conductive layer, and a third conductive layer including titanium or molybdenum above the second conductive layer;
   a first insulation layer between the first terminal and the second terminal;
   a second insulation layer between the first insulation layer and the first terminal; and
   a fourth conductive layer extending an upper surface of the first terminal and an upper surface of the second insulation layer;
   wherein
   the first insulation layer having a first side wall part, a second side wall part opposite to the first side wall part, and an upper surface part between the first side wall part and the second side wall part,
   the second insulation layer having a first side wall part, a second side wall part opposite to the first side wall part, and an upper surface between the first side wall part and the second side wall part that faces the same direction as the upper surface of the first insulation layer,
   the semiconductor layer having a first surface and a second surface opposite to the first surface,
   the first side wall part of the first insulation layer and a first side wall part of the first terminal are opposed, and the second side wall part of the first insulation layer and a first side wall part of the second terminal are opposed,
   the first side wall part of the second insulation layer and the first side wall part of the first insulation layer are opposed and in contact with each other, and the second side wall part of the second insulation layer and the first side wall part of the first terminal are opposed and in contact with each other,
   the semiconductor layer is arranged between the first terminal and the substrate, and between the second insulation layer and the substrate, the first surface of the semiconductor layer in contact with the first conductive layer and the second insulation layer, and the second surface of the semiconductor layer facing to the substrate, and
   the first terminal and the second terminal are arranged on an exterior side of a drive circuit including a semiconductor element.

2. The semiconductor device according to claim 1, wherein the fourth conductive layer covers an upper surface of the first terminal, the upper surface of the second insulation layer, and extends to the first insulation layer.

3. The semiconductor device according to claim 1, wherein the fourth conductive layer is a metal oxide having conductivity.

4. The semiconductor device according to claim 1, wherein the first insulation layer is an inorganic insulation material.

5. The semiconductor device according to claim 1, wherein the second insulation layer is an organic insulation material.

6. The semiconductor device according to claim 1, wherein the second insulation layer covers the first terminal and an upper surface of the second terminal at a ratio of less than 50% in planar view.

7. The semiconductor device according to claim 1, wherein the second insulation layer covers the upper surface of the first insulation layer at a ratio of less than 50% in planar view.

8. The semiconductor device according to claim 1, further comprising a pixel region including a plurality of pixels.

9. The semiconductor device according to claim 8, wherein the pixel region includes a region stacked with the first insulation layer and the second insulation layer, and a thickness of the second insulation layer in the first terminal and the second terminal is 50% or less of a thickness of the second insulation layer in the pixel part.

10. The semiconductor device according to claim 8, wherein the pixel region includes a plurality of pixels, each of the plurality of pixels includes at least one of a semiconductor element and a light emitting element, the light emitting element includes a pixel electrode, an opposite electrode, and an organic layer sandwiched by the pixel electrode and the opposite electrode, and the pixel electrode includes a transparent conductive film having at least two layers and a metal film is sandwiched by the two layers of the transparent conductive film.

11. A manufacturing method of a semiconductor device comprising:
    forming a semiconductor layer above a substrate;
    forming a first insulation layer in a stripe shape in a terminal region covering a semiconductor element in a drive circuit part;
    stacking a first conductive layer including titanium or molybdenum, a second conductive layer including aluminum, and a third conductive layer including titanium or molybdenum, and forming a first terminal and a second terminal at a position sandwiching the first insulation layer;
    forming a second insulation layer to cover the first terminal and a side wall of the second terminal between the first terminal and the first insulation layer and between the second terminal and the first insulation layer; and
    forming a fourth conductive layer reaching an upper surface of the first terminal and an upper surface of the first insulation layer,
    wherein
    a first side wall part of the first terminal and a first wall part of the first insulation layer are formed to face each other, and a first side wall part of the second terminal and a second wall part of the first insulation layer are formed to face each other,
    a first side wall part of the second insulation layer is formed in contact with the first side wall part of the first insulation layer, and a second side wall part of the second insulation layer is formed in contact with the first side wall part of the first terminal, and
    the first conductive layer and the second insulation layer are in contact with the semiconductor layer in the terminal region.

12. The manufacturing method of a semiconductor device according to claim 11, wherein the fourth conductive layer is formed covering an upper surface of the first terminal and an upper surface of the second insulation layer to reach the first insulation layer.

13. The manufacturing method of a semiconductor device according to claim 11, wherein the fourth conductive layer is a metal oxide having conductivity.

14. The manufacturing method of a semiconductor device according to claim 11, wherein the first insulation layer is an inorganic insulation material.

15. The manufacturing method of a semiconductor device according to claim 11, wherein the second insulation layer is an organic insulation material.

16. The manufacturing method of a semiconductor device according to claim 11, wherein the second insulation layer covers the first terminal and an upper surface of the second terminal at a ratio of less than 50% in planar view.

17. The manufacturing method of a semiconductor device according to claim 11, wherein the second insulation layer covers an upper surface of the first insulation layer at a ratio of less than 50% in planar view.

18. The manufacturing method of a semiconductor device according to claim 11, wherein after the second insulation layer is formed using a thick film buried with the first terminal, second terminal and first insulation layer, a process for reducing the thick film is performed so as to expose at least the first terminal and an upper surface of the second terminal.

19. The manufacturing method of a semiconductor device according to claim 18, wherein the second insulation layer is formed using a photosensitive organic film, and the process for reducing the thick film is performed by an exposure process and a development process of the photosensitive organic film using a half-tone mask.

* * * * *